United States Patent
Mii et al.

(10) Patent No.: US 7,621,436 B2
(45) Date of Patent: Nov. 24, 2009

(54) WIRE BONDING METHOD

(75) Inventors: Tatsunari Mii, Tachikawa (JP);
Toshihiko Toyama, Tokorozawa (JP);
Hiroaki Yoshino, Akishima (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 111 days.

(21) Appl. No.: 11/598,970

(22) Filed: Nov. 14, 2006

(65) Prior Publication Data

US 2007/0108256 A1    May 17, 2007

(30) Foreign Application Priority Data

Nov. 14, 2005    (JP)    ............... 2005-328291

(51) Int. Cl.
*B23K 31/00* (2006.01)
*B23K 31/02* (2006.01)

(52) U.S. Cl. ............ 228/180.5; 228/4.5; 228/904; 438/617

(58) Field of Classification Search .......... 228/180.5, 228/4.5, 904; 438/617
See application file for complete search history.

(56) References Cited

U.S. PATENT DOCUMENTS 6,173,885 B1 * 1/2001 Takahashi et al. ........ 228/180.5
6,270,000 B1 * 8/2001 Nishiura .................. 228/180.5
2003/0019098 A1 * 1/2003 Wildner ........................ 29/843

FOREIGN PATENT DOCUMENTS

| JP | 4-370942 | 12/1992 |
|----|----------|---------|
| JP | 9-51011 | 2/1997 |
| JP | 2000-82717 | 3/2000 |

\* cited by examiner

*Primary Examiner*—Jessica L Ward
*Assistant Examiner*—Erin B Saad
(74) *Attorney, Agent, or Firm*—William L. Androlia; H. Henry Koda

(57) ABSTRACT

A wire bonding method including the steps of: descending a capillary 5 from above an external lead 1 to press a wire 10 to such an extent that the wire is not completely connected to the external lead 1, thus forming a thin part 16 in the wire; next ascending the capillary 5 and the thin part 16 to substantially the same height as a first bonding point A, then moving the capillary 5 in a direction away from the first bonding point A, thus making a linear wire portion 18 and then cutting the wire at the thin part 16; then connecting the end 19 (thin part) of the linear wire portion 18 and the wire tip end 20 at the lower end of the capillary 5 are connected to the external lead 1; and then separating the wire tip end 20 from the external lead 1.

11 Claims, 6 Drawing Sheets

WIRE BONDING METHOD

BACKGROUND OF THE INVENTION

The present invention relates to a wire bonding method for making connection between a die electrode pad and an external lead and more particularly to a method for forming low wire loop during wire bonding.

In wire bonding, when, in order to bond a wire at a second bonding point, a capillary is moved to slightly above the second bonding point, excess wire hangs down from the lower end of the capillary, and a wire shape develops in which a hanging down part is formed. This hanging down part causes a repulsion to occur, when the wire is bonded at the second bonding point, so as to swell upward, resulting in that the straightness of the wire loop deteriorates. Japanese Patent Application Laid-Open Disclosure Nos. (1992) 4-370941 (Japanese Patent No. 3049515) and 2000-82717 disclose wire bonding methods for preventing wire loop from swelling at the time that bonding is made to the second bonding point.

In the method of Japanese Patent Application Laid-Open Disclosure (1992) No. 4-370941 (Japanese Patent No. 3049515), after connecting a wire to a first bonding point, the capillary is positioned slightly above the second bonding point and slightly on the first bonding point side, and then the capillary is descended diagonally in the direction of the second bonding point, thus bonding the wire at the second bonding point. In other words, in the method of Japanese Patent Application Laid-Open Disclosure (1992) No. 4-370941, by way of causing the capillary to descend diagonally, the hanging down part that hangs down from the lower end of the capillary is absorbed.

In the method disclosed in Japanese Patent Application Laid-Open Disclosure (2000) No. 2000-82717, after the wire is connected to a first bonding point, the capillary is lowered slightly from a second bonding point to the first bonding point side so that the capillary presses the hanging down part hanging down from the lower end of the capillary against a horizontal surface, then the capillary is moved to above the second bonding point and then is caused to descend, thus bonding the wire at the second bonding point. In other words, in the method of Japanese Patent Application Laid-Open Disclosure (2000) No. 2000-82717, the wire hanging down from the lower end of the capillary is pressed against a horizontal surface prior to bonding at the second bonding point; as a result, swelling of the wire loop at the time of bonding to the second bonding point is prevented.

Though not directly related to the problems the present invention would resolve, Japanese Patent Application Laid-Open Disclosure (1997) No. 9-51011 hereinafter "JP'51011," the disclosure of which is herein incorporated by reference, discloses a wire bonding method in which the height of the wire loop from the first bonding point is formed low, of this specification. In this method, in other words, a ball is formed at the tip end of the wire, and this ball is pressure-bonded to a die electrode pad to form a pressure-bonded ball, and then, after performing loop control for moving the capillary to ascend or moving it horizontally, or the like, the wire is pressure-bonded on the pressure-bonded ball to form a wire bonding part. According to JP'51011, by way of performing bonding to the first bonding point, the wire loop height from the first bonding point can be low. For more information on low height loop at the first bonding point, see JP'51011 which is incorporated herein by reference Even if the capillary is caused to descend diagonally prior to bonding to a second bonding point as disclosed in Japanese Patent Application Laid-Open Disclosure (1992) No. 4-370941 (Japanese Patent No. 3049515), the hanging down part of the wire at the lower end of the capillary, though it is less than that in the conventional method of bonding to a second bonding point, still remains nevertheless. Accordingly, the repulsion caused by plastic deformation of the hanging down part in the wire at the time of bonding at the second bonding point is not avoidable, and swelling occurs in the slanted part of the wire loop.

When the hanging down part is pressed against a horizontal surface, as in the method disclosed in Japanese Patent Application Laid-Open Disclosure (2000) No. 2000-82717, such a banging down part disperses in the interior of the capillary and in the slanted part of the wire loop, causing those respective portions to get loosened. When the capillary ascends to a certain height in the next step, the wire that was loose inside the capillary will be pushed back downward and come out at the lower end of the capillary. Since the wire that came out at the lower end of the capillary at the next bonding to the second bonding point is pressed against the second bonding point, similar to Japanese Patent Application Laid-Open Disclosure (1992) No. 4-370941 repulsion caused by plastic deformation in the wire occurs, and swelling does occur in the slanted part of the wire loop though the amount thereof is smaller than with the conventional method of bonding to the second bonding point.

SUMMARY OF THE INVENTION

Accordingly, the object of the present invention is to provide a wire bonding method in which wire loop is prevented from swelling, thus improving the wire loop straightness.

The above object is accomplished by a set of unique steps of the present invention for a wire bonding method for connecting a wire, which passes through a capillary, between an electrode pad that is a first bonding point and an external lead that is a second bonding point with a use of the capillary; and in the present invention, after finishing bonding to the electrode pad (first bonding point), the capillary is, together with a clamper, moved to above the external lead (second bonding point);

then the capillary (and the clamper) is, with the clamper opened, caused to descend from above the external lead, so that the wire is pressed to such extent as that the wire is not completely connected to the external lead, thus forming a thin part in the wire;

next the clamper is closed, and the capillary (and the closed clamper) is caused to ascend, together with the thin part, to substantially the same height as the first bonding point;

the capillary (and the clamper) is next moved in a direction away from (or opposite from) the first bonding point, thus pulling the wire bonded to the first bonding point, so that the pulled wire is made into a linear wire portion, and in conjunction therewith, is cut (separated) at the thin part;

then the capillary (and the clamper) is moved back in the direction toward the first bonding point and then caused to descend so that the end of the linear wire portion, or the thin part at the end of the linear wire portion, is pressed by the capillary and bonded to the external lead (second bonding point) and, in conjunction therewith, the wire tip end at the lower end of the capillary is bonded also to the external lead; and further, the clamper is opened, and the capillary (and the clamper) is caused to ascend; and during this ascending motion of the capillary, the clamper is closed so that the wire tip end at the lower end of the capillary peeled away (separated) from the external lead, thus forming a tail portion on the wire extending out of the lower end of the capillary, such a tail portion to be used for the next first bonding.

The above object is accomplished by another set of unique steps of the present invention for a wire bonding method for connecting a wire, which passes through a capillary, between an electrode pad that is a first bonding point and an external lead that is a second bonding point with a use of the capillary; and in the present invention, after finishing bonding to the electrode pad (first bonding point), the capillary is, together with a clamper, moved to above the external lead (second bonding point);

then the capillary (and the clamper) is, with the clamper opened, caused to descend from above the external lead, so that the wire is pressed to such extent as that the wire is not completely connected to the external lead, thus forming a thin part in the wire;

next the clamper is closed, and the capillary (and the closed clamper) is caused to ascend, together with the thin part, to substantially the same height as the first bonding point;

the capillary (and the clamper) is next moved in a direction away from (or opposite from) the first bonding point, thus pulling the wire bonded to the first bonding point, so that the pulled wire is made into a linear wire portion, and in conjunction therewith, is cut (separated) at the thin part;

next, the capillary (and the clamper) is caused to descend, and the wire tip end at the lower end of the capillary is bonded to the external lead;

then, the clamper is opened, and the capillary (and the clamper) is caused to ascend; and during this ascending motion of the capillary, the clamper is closed so that the wire tip end at the lower end of the capillary peeled away (separated) from the external lead, thus forming a tail portion on the wire extending out of the lower end of the capillary;

after forming a ball in this tail portion, the clamper is opened, and the capillary (and the clamper) is moved back in the direction toward the first bonding point and then caused to descend so that the ball is pressed against the end of the above-described linear wire portion, and the ball, together with the end of the linear wire portion, is bonded to the external lead, thus forming a pressure-bonded ball; and then the capillary (and the clamper) is caused to ascend, and during this ascending motion of the capillary, the clamper is closed, so that the wire is cut from the pressure-bonded ball, thus forming a tail portion extending out of the lower end of the capillary, such a tail portion to be used for the next first bonding.

As seen from the above, in the present invention, the capillary is, after the bonding at the first bonding point, moved in a direction away from the first bonding point, thus pulling the wire connected to the first bonding point and making it a linear wire portion, and then this linear wire portion is cut (separated) from the wire at the thin part. Thus, with this step, a spring-up part is formed in the wire bonded to the first bonding point and is then pulled and cut at the thin part to make a one-side supported linear wire portion, and the end of this one-side supported linear wire portion is pressed by the capillary and bonded to the external lead, wherefore wire loop straightness is enhanced.

DETAILED DESCRIPTION OF THE INVENTION

Figure 1A:
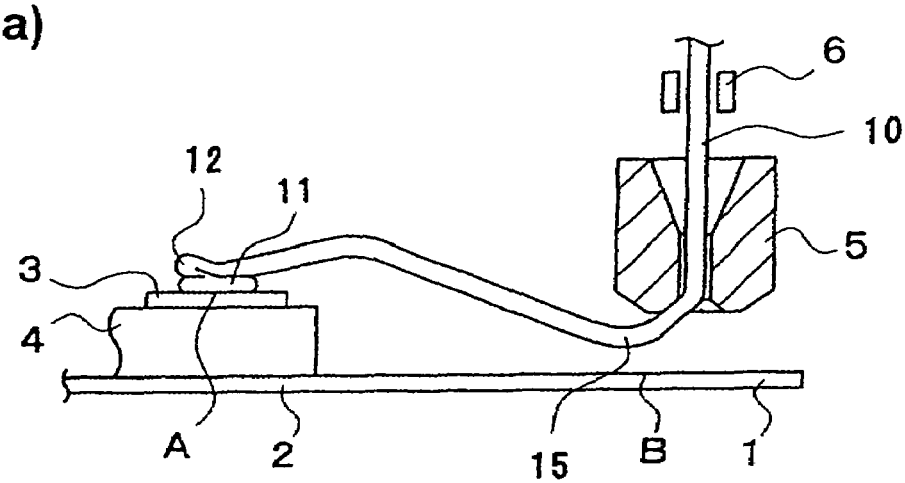
FIGS. 1(a) through 1(c) show the steps of the wire bonding method according to the first embodiment of the present invention.

A first embodiment of the wire bonding method of the present invention will be described with reference to FIGS. 1(a) through 3(b).

On a lead frame 2 on which an external lead 1 is formed, a die 4 having thereon an electrode pad 3 is formed is mounted. As seen from FIG. 3(b), a wire 10 passes through a capillary 5. The reference numeral 6 indicates a clamper which makes the same horizontal and vertical motions as the capillary 5 whenever the capillary 5 is moved horizontally and vertically.

First of all, bonding is performed at the first bonding point A (first bonding) shown in FIG. 1(a), thus forming a pressure-bonded ball 11 and, on the pressure-bonded ball 11, a wire bonding part 12. The forming of this pressure-bonded ball 11 and wire bonding part 12 is effected by the method of, for instance, Japanese Patent Application Laid-Open Disclosure (1997) No. 9-51011. For more information on low height loop at the first bonding point, see JF'51011 which is incorporated herein by reference.

Figure 3A:
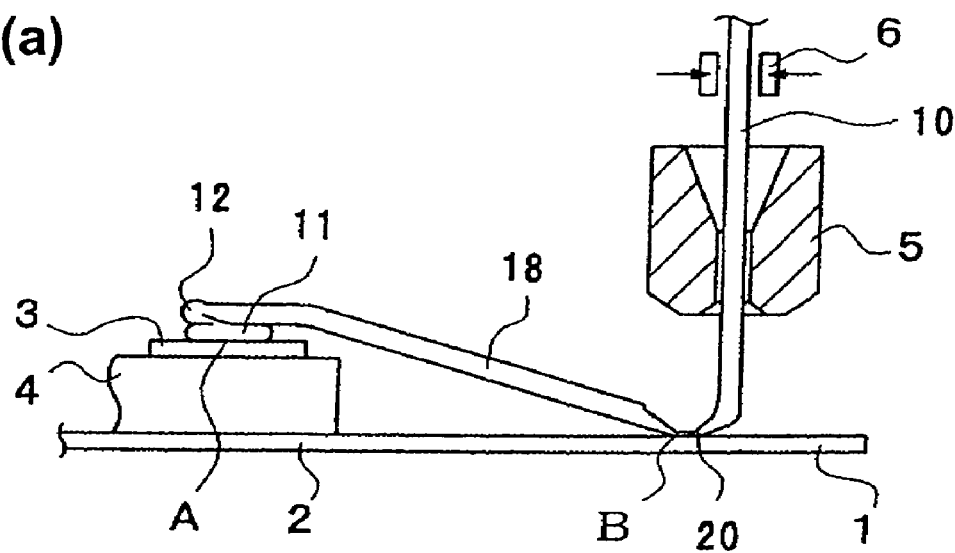
FIGS. 3(a) and 3(b) show the steps continuing from FIG. 2(c)
Figure 3B:
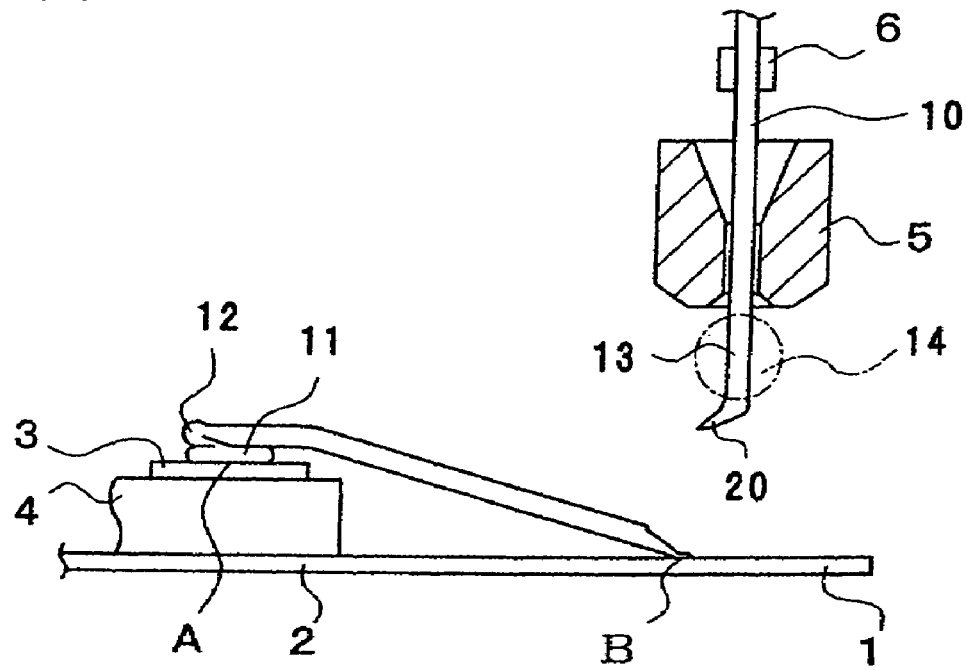

In other words, as seen from FIG. 3(b), with the clamper 6 closed, a ball 14 is formed in the tail piece 13 of the wire extending out of the lower end of the capillary 5, by a spark discharge made by an electric torch (not shown in the drawings).

Next, the clamper 6 attains its open condition, the capillary 5 (and the clamper 6) descends after moving above the first bonding point A, and the ball 14 is bonded to the first bonding point A, and then, as seen from FIG. 1(a), the pressure-bonded ball 11 is formed.

Then, after performing loop control for moving the capillary 5 (and the clamper 6) so as to ascend or moving it horizontally, or the like, the wire 10 is pressure-bonded on the pressure-bonded ball 11 to form the wire bonding part 12.

After that, the capillary 5 (and the clamper 6) is moved so that the capillary 5 is positioned slightly above the second bonding point B of the external lead 1. In this case, a hanging down part 15 of the wire resulting from the excess wire 10 hanging down from the lower end of the capillary 5 is formed.

Figure 1B:
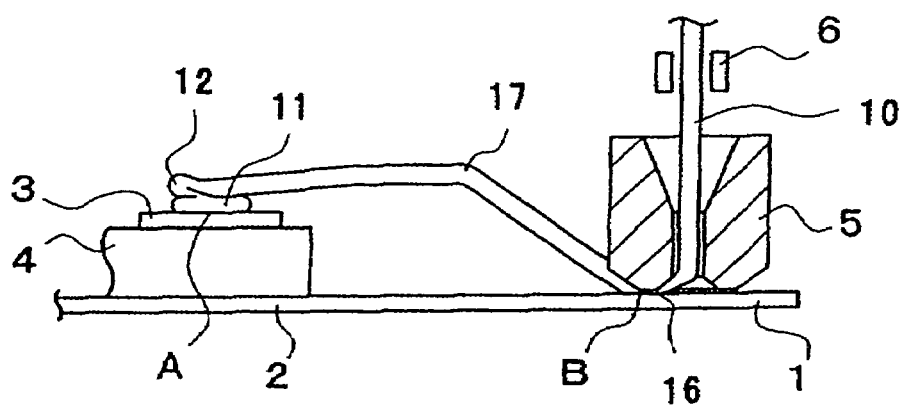

Next, as shown in FIG. 1(b), the capillary 5 (and the clamper 6) is caused to descend, the wire 10 is pressed against the external lead 1 of the lead frame 2, and as a result a thin part 16 is formed in the wire. When the wire 10 is pressed against the external lead 1, the hanging down part 15 of the wire springs up, forming a spring-up part 17; and in this case, the thin part 16 of the wire is not completely connected to the external lead 1; in other words, a part of the wire is pressed (crushed) by the capillary to make the thin part 16 so that the thin part 16 is raised together with the capillary when the clamper 6 closes and the capillary 5 ascends (with the clamper 6) in the next step shown in FIG. 1(c).

Figure 1C:
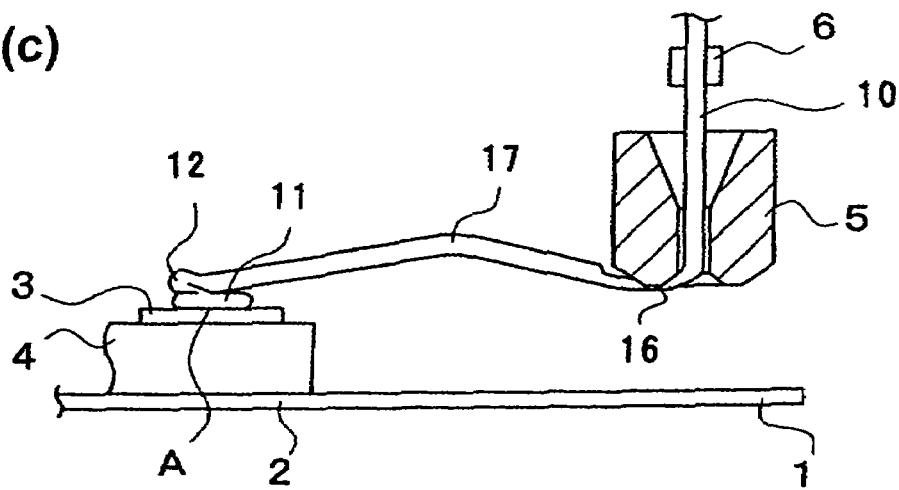

Next, the clamper 6 closes and, as shown in FIG. 1(c), the capillary 5 is caused to ascend to substantially the same height as the first bonding point A.

Figure 2A:
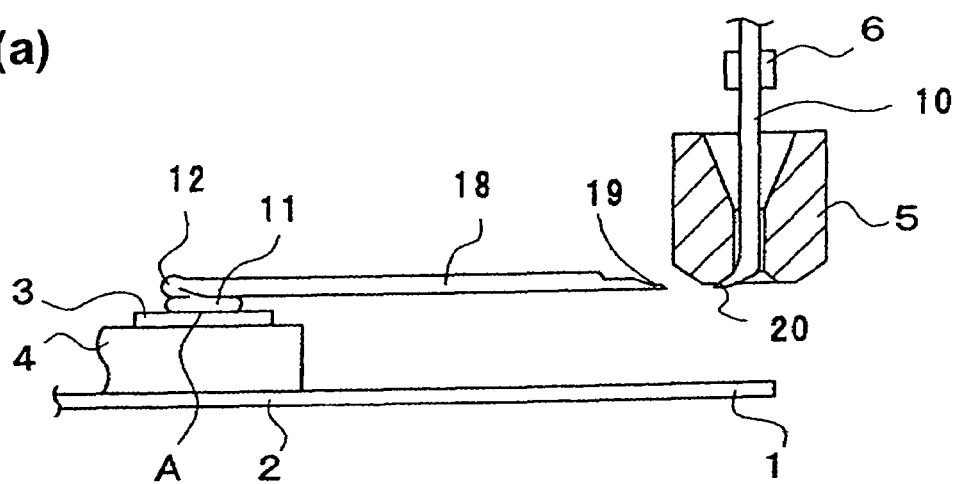
FIGS. 2(a) through 2(c) show the steps continuing from FIG. 1(c)

Then, as shown in FIG. 2(a), the capillary 5 (and the clamper 6) is moved horizontally in a direction away from (or opposite from) the first bonding point A with the clamper closed. With this horizontal motion of the capillary 5 (and the clamper 6), the spring-up part 17 is pulled, and a substantially linear wire portion 18 is formed in the wire that is bonded to the first bonding point, and, in conjunction therewith, the linear wire portion 18 is cut at the thin part 16.

Figure 2B:
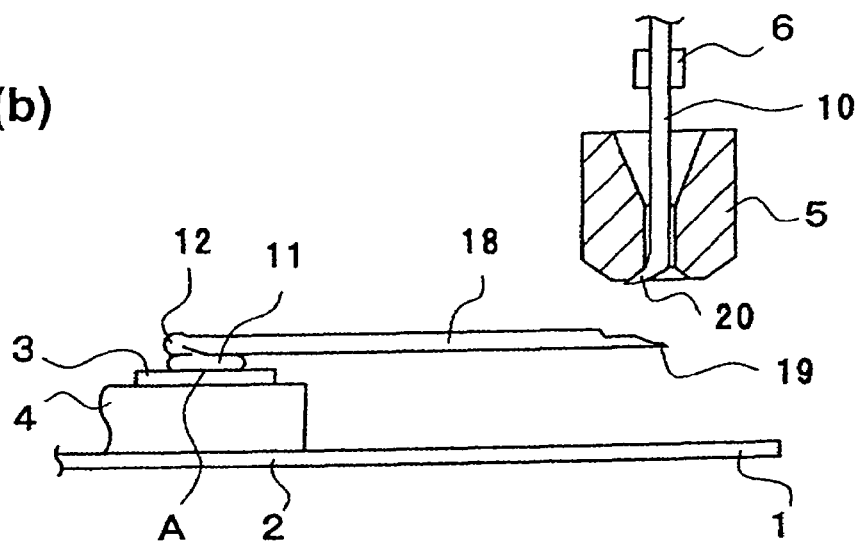

Next, as shown in FIG. 2(b), the capillary 5 (and the clamper 6) is moved back in a direction toward the first bonding point A so that the lower end of the capillary 5 is positioned above the end 19 of the linear wire portion 18 that has the thin part.

Figure 2C:
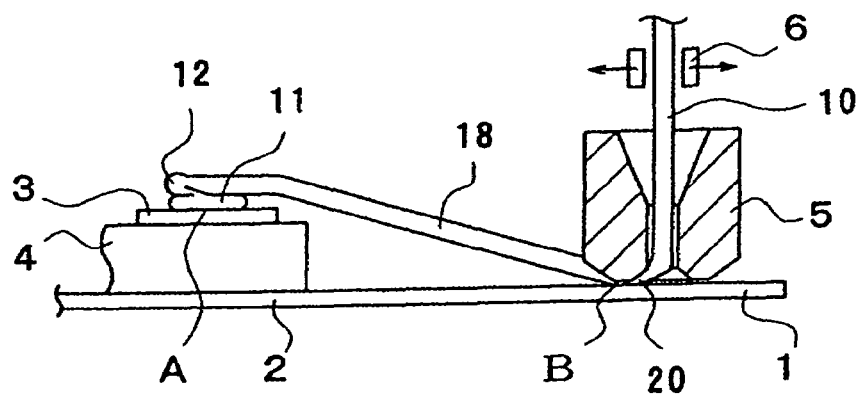

In the next step (second bonding) shown in FIG. 2(c), the capillary 5 (and the clamper 6) is caused to descend, and the end 19 of the linear wire portion 18 is bonded to the external lead 1 or at the second bonding point B. At this time, the wire tip end part 20 extending slightly from the lower end of the capillary 5 is connected also to the external lead 1.

Then, the clamper 6 opens as shown in FIG. 2(c); and, as shown in FIGS. 3(a) and 3(b), the capillary 5 (and the clamper 6) is ascended. During this ascending motion of the capillary 5 (and the clamper 6), that is, when the capillary 5 (and the clamper 6) is ascending in FIG. 3(a), the clamper 6 closes as shown by arrows in FIG. 3(a). As a result, as shown in FIG. 3(b), the wire is pulled upward by the clamper, and the wire tip end part 20 is peeled away (separated) from the external lead 1, and as a result, a tail piece 13 is formed in the wire at the lower end of the capillary 5. After a ball 14 is formed in this tail piece 13 by an electric torch (not shown), the bonding process shifts to the step shown in FIG. 1(a).

As seen from the above, in the steps shown in FIG. 1(c) to FIG. 2(a), the spring-up part 17 is pulled and is cut at the thin part 16, thus forming a one-side supported linear wire portion 18. The end 19 of this one-side supported linear wire portion 18 is, as seen from FIGS. 2(b) and 2(c), pressed by the capillary 5 and bonded to the second bonding point B; accordingly, wire loop straightness is enhanced.

Figure 4A:
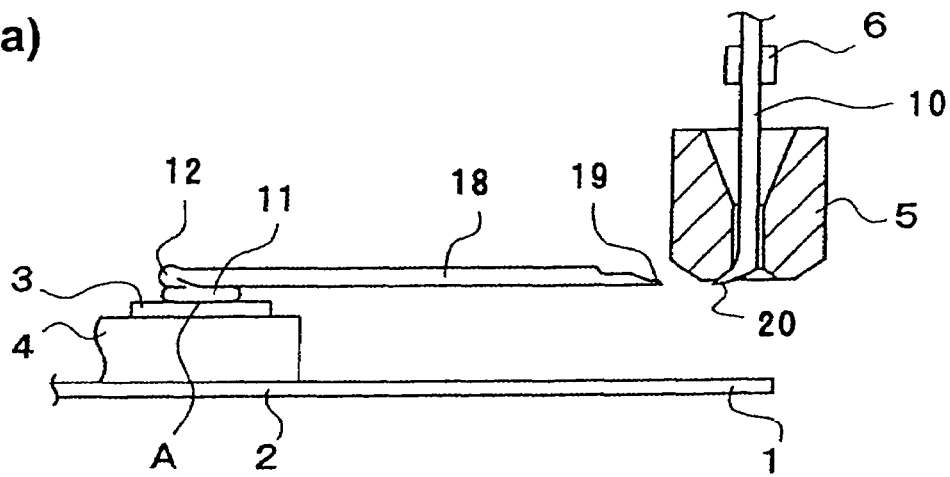
FIGS. 4(a) through 4(c) show the steps of the wire bonding method according to the second embodiment of the present invention.

A second embodiment of the wire bonding method of the present invention will be described with reference to FIGS. 4(a) to 6(b). The second embodiment takes the same steps as in the above-described first embodiment shown in FIG. 1(a) to FIG. 2(a). FIG. 4(a) corresponds to the step shown in FIG. 2(a).

In the above-described first embodiment, after the step shown in FIG. 2(a), the end 19 of the linear wire portion 18 is bonded directly to the second bonding point B by the capillary 5. In this second embodiment, after the step of FIG. 4(a) (FIG. 2(a)), the end 19 of the linear wire portion 18 is not bonded directly to the second bonding point B by the capillary 5.

Figure 4B:
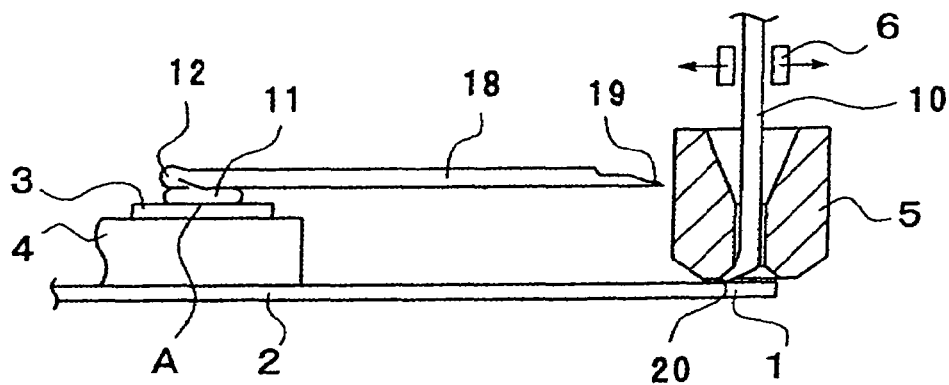

After the step shown in FIG. 4(a) (or the steps in FIGS. 1(a) through 2(a)), the capillary 5 (and the clamper 6) is, as shown in FIG. 4(b), caused to descend, and the wire tip end part 20 is lightly connected (prebonded) to the external lead 1.

Figure 4C:
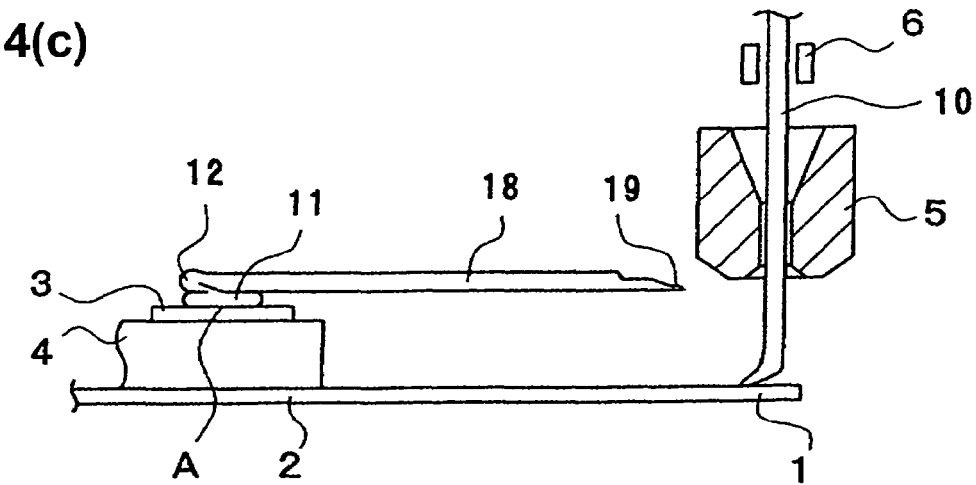
Figure 5A:
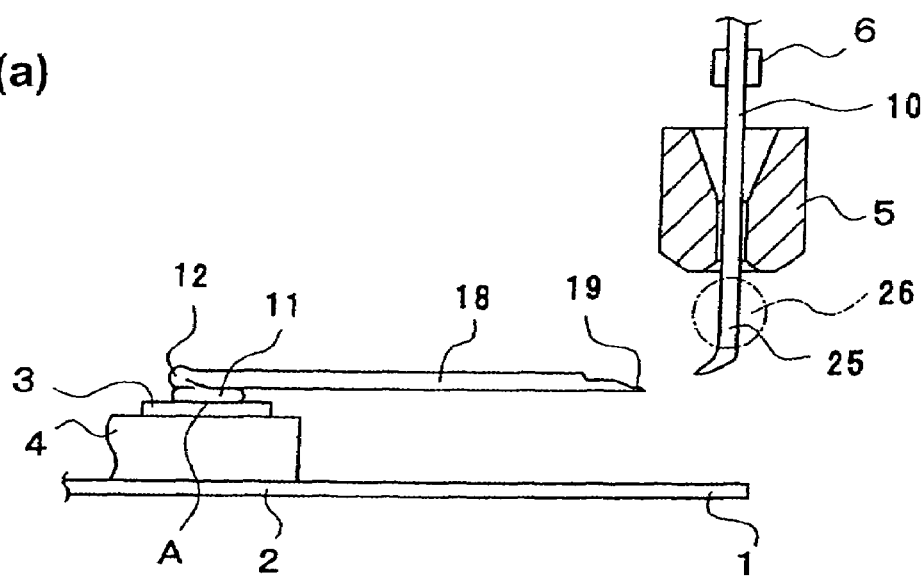
FIGS. 5(a) through 5(c) show the steps continuing from FIG. 4(c)
Figure 5B:
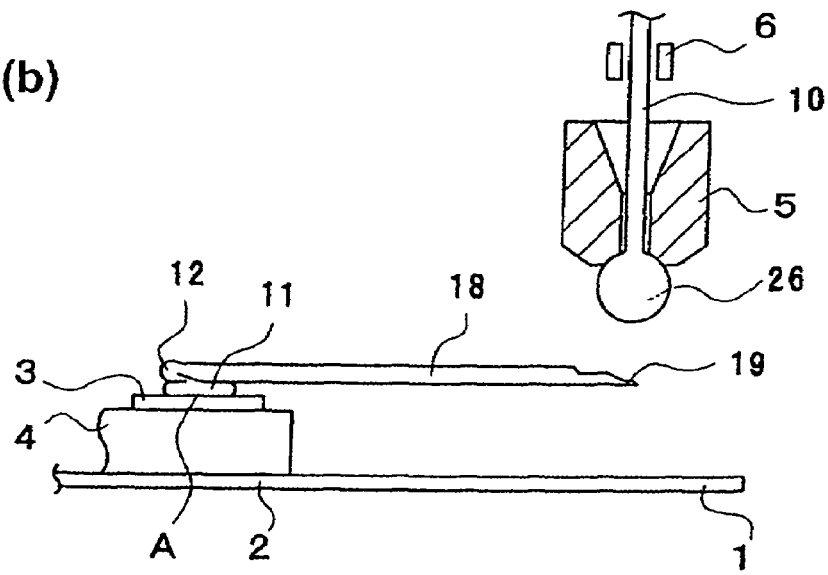

Then, the clamper 6 next opens as shown in FIG. 4(b); and, as seen from FIGS. 4(c) and 5(a), the capillary 5 (and the clamper 6) is caused to ascend. During this ascending motion of the capillary 5 (and the clamper 6), that is, when the capillary 5 (and the clamper 6) is ascending in FIG. 4(c), the clamper 6 closes. As a result, as shown in FIG. 5(a), the wire tip end part 20 is peeled away (separated) from the external lead 1, and a tail portion 25 is formed in the wire in the lower end of the capillary 5. In this tail portion 25, a ball 26 is next formed by a spark discharge made by an electric torch (not shown).

Next, with the clamper 6 attaining its open condition, and the capillary 5 (and the clamper 6) is moved back in the direction toward the first bonding point A and to above the end 19 of the linear wire portion 18.

Figure 5C:
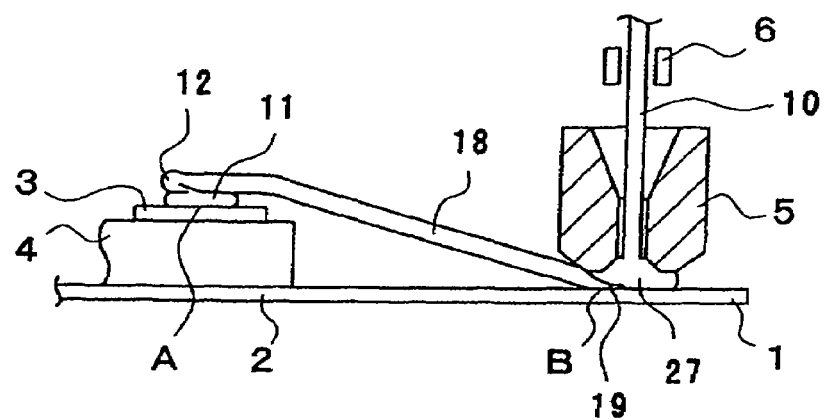

Then, as shown in the step (second bonding) of FIG. 5(c), the capillary 5 (and the clamper 6) is descended, thus pressing the end 19 of the linear wire portion 18 against the external lead 1, and, in conjunction therewith, bonding the ball 26 on the end 19 of the linear wire portion 18 to the external lead 1, thus forming a pressure-bonded ball 27.

Figure 6A:
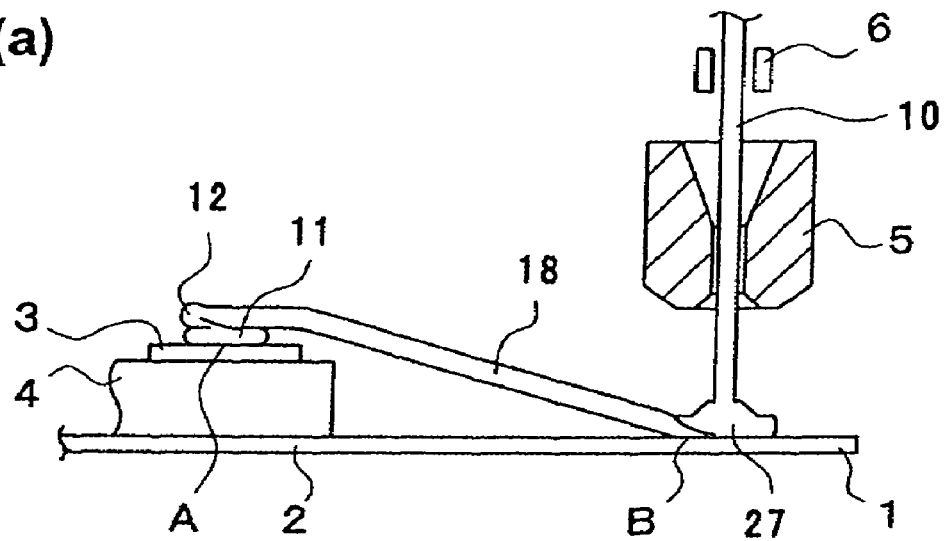
FIGS. 6(a) and 6(b) show the steps continuing from FIG. 5(c).
Figure 6B:
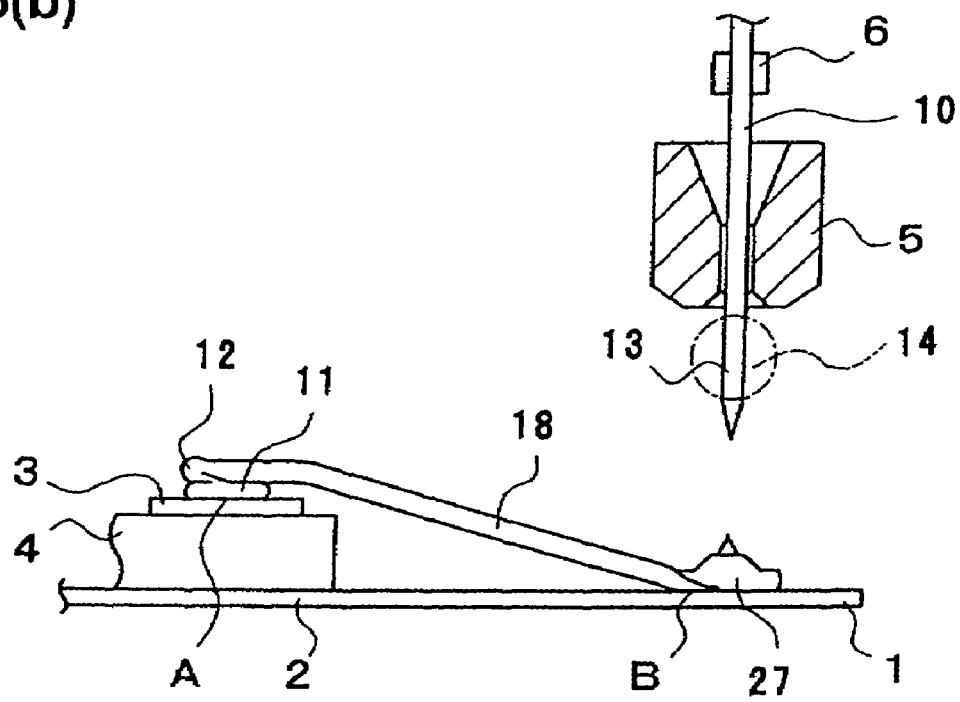

Next, as shown in FIGS. 6(a) and 6(b), the capillary 5 (and the clamper 6) is caused to ascend. During the ascending motion of the capillary 5 (and the clamper 6), that is, when the capillary 5 (and the clamper 6) is ascending in FIG. 6(a), the clamper 6 closes; as a result, as seen from FIG. 6(b), the wire 10 is cut from the upper end of the pressure-bonded ball 27, and the tail piece 13 is formed in the wire at the lower end of the capillary 5. After forming a ball 14 in the tail piece 13 by a spark discharge made by an electric torch (not shown), the bonding process shifts to the step shown in FIG. 1(a).

In this second embodiment of the present invention as well, since the end 19 of the one-side supported linear wire portion 18 is bonded to the second bonding point B, wire loop straightness is enhanced as in the above-described first embodiment. In this second embodiment, moreover, since the pressure-bonded ball 27 is formed in the end 19 bonded to the second bonding point B, the thickness of the bonding to the second bonding point B is thick (or thicker than in the first embodiment), and the strength at the second bonding point B is enhanced.

In the embodiments described above, the bonding to the first bonding point A is performed in accordance with the method disclosed in JP'51011 which is incorporated herein by reference; however, the present invention is not limited to use this method, and any ordinary bonding method can be used in the present invention. However, with the bonding method of JP'51011 which is incorporated herein by reference, it is possible to keep the rise from the first bonding point A low, which is preferable.

The invention claimed is:

1. A wire bonding method for connecting a wire passing through a capillary between a first bonding point and a second bonding point with a use of said capillary, said method comprising, in the order stated, the steps of:

opening a clamper and executing a first bonding of a ball preformed on a tip end of the wire of said capillary onto the first bonding point, to thereby form a pressure-bonded ball;

moving said capillary vertically and horizontally while carrying out loop control;

executing crush bonding the wire to the vicinity of the top of the pressure bonded ball on the first bonding point, to thereby form a wire bonding part;

moving said capillary above a second bonding point for looping the crushed bonding part to the second bonding point;

forming a thin part in the wire by descending said capillary from above the second bonding point and pressing the wire at a lower end of said capillary against the second bonding point;

closing the clamper and ascending said capillary together with the thin part in the wire;

forming a linear wire portion in the wire by pulling the first-bonded wire to move the capillary in a substantially horizontal direction and in a direction away from the first bonding point toward the second bonding point;

breaking the linear wire portion at the thin part in the wire by moving further said capillary in a substantially horizontal direction and in the direction away from the first bonding point toward the second bonding point, to thereby form a wire tip end part at a tip end of said capillary; and executing a second bonding the wire tip end part of said capillary onto the second bonding point during pressing the thin part formed at the end of the linear wire portion, by use of said capillary, onto the second bonding point.

2. The wire bonding method according to claim 1, further comprising, after the second bonding on the second bonding point, in the order stated, the steps of:

opening the clamper;

peeling the thin part of a tip end of the wire at the lower end of said capillary by ascending said capillary from the second-bonded linear wire portion;

closing the clamper being opened during ascending motion of said capillary;

forming a tail portion in the wire extending out from the lower end of said capillary; and forming a ball, used for the next first bonding beforehand, by a spark discharge made by an electric torch.

3. The wire bonding method according to claim 1, further comprising, after the second bonding on the second bonding point, in the order stated, the steps of:

opening the clamper;

peeling the thin part of a tip end of the wire at the lower end of said capillary by ascending said capillary from the second-bonded linear wire portion;

closing the clamper being opened after said capillary is stopped into a stationary state during ascending motion of said capillary, then ascending further said capillary;

forming a tail portion in the wire extending out from the lower end of said capillary; and forming a ball, used for the next first bonding beforehand, by a spark discharge made by an electric torch.

4. The wire bonding method according to claim 1, wherein after forming the thin part, a height to be ascended of said capillary is at least substantially same height of the first bonding point.

5. The wire bonding method according to claim 1, wherein upon executing the second bonding at the second bonding point, the tip end of the wire at the lower end of said capillary is positioned substantially directly above the thin part which is at the end of the linear wire portion.

6. A wire bonding method for connecting a wire passing through a capillary between a first bonding point and a second bonding point with a use of said capillary, said method comprising, in the order stated, the steps of:

opening a clamper and executing a first bonding of a ball preformed on a tip end of the wire of said capillary onto the first bonding point, to thereby form a pressure-bonded ball;

moving said capillary vertically and horizontally while carrying out loop control;

executing crush bonding the wire to the vicinity of the top of the pressure-bonded ball on the first bonding point, to thereby form a wire bonding part;

moving said capillary above a second bonding point for looping the crushed wire bonding part to the second bonding point;

forming a thin part in the wire by descending said capillary from above the second bonding point and pressing the wire at a lower end of said capillary against the second bonding point;

closing the clamper and ascending said capillary together with the thin part in the wire, forming a linear wire portion in the wire by pulling the first-bonded wire to move said capillary in a substantially horizontal direction and in a direction away from the first bonding point toward the second bonding point;

breaking the linear wire portion at the thin part in the wire by moving further said capillary in a substantially horizontal direction and in the direction away from the first bonding point toward the second bonding point, to thereby form a wire tip end part at a tip end of said capillary;

pre-bonding a tip end of the wire at the lower end of said capillary to a point in a vicinity of the second bonding point by descending said capillary;

opening the clamper and peeling the tip end of the wire by ascending said capillary from said point in a vicinity of the pre-bonded second bonding point;

closing the clamper and forming a ball, used for second bonding, in a tail portion on the wire extending out from the lower end of said capillary, by a spark discharge made by an electric torch;

opening the clamper and pressing the ball against the end of the linear wire portion; and executing a second bonding for bonding an end of the linear wire portion together with the ball onto the second bonding point and, in conjunction therewith, forming a pressure-bonded ball on the second bonding point.

7. The wire bonding method according to claim 6, further comprising, after the second bonding on the second bonding point, in the order stated, the steps of:

closing the clamper being opened during ascending motion of said capillary;

breaking the pressure-bonded ball by ascending said capillary from the second-bonded point;

forming a tail portion in the wire extending out from the lower end of said capillary; and forming a ball, used for the next first bonding beforehand, by a spark discharge made by an electric torch.

8. The wire bonding method according to claim 6, further comprising, after the second bonding on the second bonding point, in the order stated, the steps of:

closing the clamper being opened after said capillary is stopped into a stationary state during ascending motion of said capillary, then ascending further said capillary;

breaking the pressure-bonded ball by ascending said capillary from the second-bonded point;

forming a tail portion in the wire extending out from the lower end of said capillary; and forming a ball, used for the next first bonding beforehand, by a spark discharge made by an electric torch.

9. The wire bonding method according to claim 6, wherein after forming the thin part, a height to be ascended of said capillary is at least substantially same height of the first bonding point.

10. The wire bonding method according to claim 6, wherein upon executing the second bonding at the second bonding point, the tip end of the wire at the lower end of said capillary is positioned substantially directly above the thin part which is at the end of the linear wire portion.

11. The wire bonding method according to claim 6, wherein a part on an outer side of the wire second-bonded at the second bonding point is on an external lead.

* * * * *